(12) United States Patent
Matsuo et al.

(10) Patent No.: US 6,391,482 B1
(45) Date of Patent: May 21, 2002

(54) ORGANIC MATERIAL FOR ELECTROLUMINESCENT DEVICE AND ELECTROLUMINESCENT DEVICE USING THE SAME

(75) Inventors: Mikiko Matsuo, Nara; Yoshio Kishimoto, Osaka; Tetsuya Satou, Osaka; Hitoshi Hisada, Osaka; Hisanori Sugiura, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/495,654

(22) Filed: Feb. 1, 2000

(30) Foreign Application Priority Data

Feb. 4, 1999 (JP) .......................................... 11-027468
Jun. 22, 1999 (JP) .......................................... 11-174987
Jul. 29, 1999 (JP) .......................................... 11-241712

(51) Int. Cl.$^7$ .............................................. H05B 33/14
(52) U.S. Cl. ...................... 428/690; 428/917; 428/704; 313/504; 313/506; 252/301.16; 252/301.26; 257/40; 257/103
(58) Field of Search ................................ 428/690, 917, 428/704; 313/504, 506; 252/301.16, 301.26; 548/110; 257/40, 103

(56) References Cited

U.S. PATENT DOCUMENTS

| | | |
|---|---|---|
| 3,681,381 A | 8/1972 | Trofimenko |
| 4,539,507 A | 9/1985 | VanSlyke et al. |
| 4,769,292 A | 9/1988 | Tang et al. |
| 5,429,884 A | 7/1995 | Namiki et al. |
| 5,601,903 A | 2/1997 | Fujii et al. |
| 5,639,914 A | 6/1997 | Tomiyama et al. |
| 5,683,823 A | 11/1997 | Shi et al. |
| 5,707,747 A | 1/1998 | Tomiyama et al. |
| 5,739,635 A | 4/1998 | Wakimoto |
| 5,792,557 A | 8/1998 | Nakaya et al. |
| 5,885,498 A | 3/1999 | Matsuo et al. |

FOREIGN PATENT DOCUMENTS

| | | |
|---|---|---|
| JP | 8-306489 | 11/1996 |
| JP | 10-45722 | 2/1998 |
| WO | WO 98/36035 | 8/1998 |

OTHER PUBLICATIONS

Tang et al. "Organic Electroluminescent Diodes", *Applied Physics Letters*, vol. 51, pp. 913–915, 1987.
Tang et al. "Electroluminescence of Doped Organic Thin Films", *Journal of Applied Physics*, vol. 65, pp. 3610–3616, 1989.
Wakimoto et al. "Organic EL Cells Using Alkaline Metal Compounds as Electron Injection Materials" *IEEE Transactions on Electron Devices*, vol. 44, No. 8, pp. 1245–1248, 1997.
European Search Report.
Leffler et al., "Triarylboron Anion Radicals and the Reductive Cleavage of Boron Compunds" Journal of the American Chemical Society, Nov. 18, 1970.

*Primary Examiner*—Cynthia H. Kelly
*Assistant Examiner*—Ling Xu
(74) *Attorney, Agent, or Firm*—Merchant & Gould PC

(57) ABSTRACT

A new organic material for an electroluminescent device suitable for an electroluminescent device and an electroluminescent device using the same. The organic material uses a complex compound expressed by the following formula (F1):

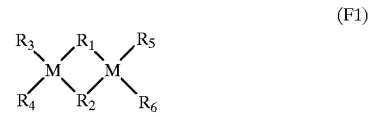

(F1)

wherein R1 and R2, which can be same or different, respectively denote one selected from the group consisting of halogen, alkyl having 1 to 3 carbon atoms, and a bridging ligand having a nitrogen-containing aromatic ring containing at least two nitrogen atoms, and when R1 or R2 is a bridging ligand having a nitrogen-containing aromatic ring, nitrogen in the nitrogen-containing aromatic ring is a coordinating atom; R3, R4, R5 and R6, which can be same or different, respectively denote one member selected from the group consisting of hydrogen, alkyl, aryl, an aryl derivative, a nitrogen-containing aromatic ring and a derivative of a nitrogen-containing aromatic ring; and M is a central metal.

21 Claims, 14 Drawing Sheets

ORGANIC MATERIAL FOR ELECTROLUMINESCENT DEVICE AND ELECTROLUMINESCENT DEVICE USING THE SAME

FIELD OF THE INVENTION

The present invention relates to an organic material for an electroluminescent device and an electroluminescent (EL) device using the same.

BACKGROUND OF THE INVENTION

An electroluminescence panel is characterized by high visibility, excellent display performance and a high-speed response. Recently, an organic electroluminescent device (hereinafter referred to also as EL device) using organic compounds is reported (see, for example, relevant document in "Applied Physics Letters," Vol. 51, p913, 1987). This document describes an organic EL device having a structure in which a hole transport layer and an organic light emitting layer are laminated.

The structure of conventional organic EL devices is explained with reference to FIGS. 11 to 14.

An organic EL device 1 of FIG. 11 includes a glass substrate 2, an anode 3 laminated on the glass substrate 2, an organic light emitting layer 4 and a cathode 5. The anode 3 is a transparent electrode.

An organic EL device 1a of FIG. 12 is called an SH-A type device. The organic EL device 1a includes a glass substrate 2, an anode 3 laminated on the glass substrate 2, a hole transport layer 6, an organic light emitting layer 4 and a cathode 5. The above-mentioned report by Tang et al. relates to the organic EL device 1a, which uses a tris (8-quinolinolato) aluminum (hereinafter, referred to also as Alq) for the organic light emitting layer 4. This Alq is an excellent light emitting material having both high luminous efficiency and high electron transporting property. Another type of the organic EL device 1a is a device in which Alq, which forms the organic light emitting layer 4, is doped with a fluorescent dye such as a coumarin derivative or DCM1, etc. (see Journal of Applied Physics, Vol. 65, p3610, 1989). According to the organic EL device 1a, the luminescent colors can be varied and the luminous efficiency can also be improved by selecting appropriate dyes.

An organic EL device 1b of FIG. 13 is called an SH-B type device. The organic EL device 1b includes a glass substrate 2, an anode 3 laminated on the glass substrate 2, an organic light emitting layer 4, an electron transport layer 7 and a cathode 5. For the electron transport layer 7, an oxadiazole derivative, typically 2-(4-biphenylyl)-5-(4-t-butylphenyl)-1,3,4-oxadiazole (hereinafter, referred to also as PBD), is often used. However, the oxadiazole derivative such as PBD etc. tends to be crystallized and is not suitable for practical use.

An organic EL device 1c of FIG. 14 is called a DH type device. The organic EL device 1c includes a glass substrate 2, an anode 3 laminated on the glass substrate 2, a hole transport layer 6, an organic light emitting layer 4, an electron transport layer 7 and a cathode 5.

At present, the SH-A type devices of FIG. 12 or the DH type devices of FIG. 14 are mainly studied and developed. As to the electron transport layer, the hole transport layer and the light emitting layer, new materials suitable for each layer's function have been developed and studied. In particular, as a hole transporting organic molecule used for the hole transport layer, a large number of materials derived from triphenylamine have been developed. Furthermore, for a fluorescent organic molecule used for the light emitting layer, a fluorescent pigment, a laser dye, etc. can be used.

Furthermore, the cathode 5 is stable and can easily inject electrons when the cathode 5 is made of an alloy of an alkali metal or an alkaline-earth metal having a low work function and a stable metal such as aluminum or silver, etc. According to one report, for example, by controlling a Li concentration contained in the alloy to be such a slight amount as 0.01 wt. % or more and 0.1 wt. % or less, an EL device can exhibit a high luminous efficiency and high stability (see, for example, Publication of Japanese Patent Application No. Hei 5-121172 A). Furthermore, according to another report, a cathode in which a thin film made of a metal having a low work function is formed as an electron injection electrode on the side of an organic compound layer, and a thin film made of a stable metal is formed thereon as a protective electrode. With such a cathode structure, since it is not necessary to control the concentration of an alkaline metal such as Li, etc. having a high reactivity with water, a cathode that easily can be manufactured can be obtained.

Furthermore, an organic EL device in which an electron injection layer is placed on the cathode at the side of the organic layer is also reported. For example, the organic EL device using an alkaline metal compound for the electron injection layer and optimizing the thickness of this electron injection layer is disclosed (see Publication of Japanese Patent Application No. Hei 9-17574A). Furthermore, the relationship between the thickness of these electron injection layers and a dark spot is reported in detail (T. Wakimoto, Y. Fukuda, K. Nagayama, A. Yokoi, H. Nakada and M. Tsuchida, IEEE Transactions on Electron Devices, Vol. 44, No. 8, p1245, 1997).

As mentioned above, in the organic EL device, the electron injection layer has been studied as an important factor for determining the luminous efficiency and lifetime.

However, conventional organic EL devices do not have satisfactory luminous efficiency, selectivity of emission wavelength and lifetime.

In particular, when the light emitting layer is formed by a doping method, it is difficult to control the concentration of a dopant. Furthermore, guest materials for emitting red light have a wide range of π electron system, so that they tend to be interacted with each other and are easily subjected to concentration quenching.

SUMMARY OF THE INVENTION

It is therefore an object of the present invention to provide a organic material suitable for an electroluminescent device and an electroluminescent device using the same.

In order to achieve the above-mentioned object, a first organic material for an EL device of the present invention is a complex compound expressed by the following formula (F1):

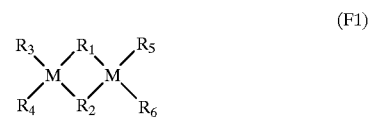

wherein R1 and R2, which can be same or different, respectively denote one selected from the group consisting of halogen, alkyl having 1 to 3 carbon atoms, and a bridging ligand having a nitrogen-containing aromatic ring containing at least two nitrogen atoms, and when R1 or R2 is a bridging ligand having a nitrogen-containing aromatic ring, nitrogen in the nitrogen-containing aromatic ring is a coordinating atom; R3, R4, R5 and R6, which can be same or different, respectively denote one member selected from the group consisting of hydrogen, alkyl, aryl, an aryl derivative, a nitrogen-containing aromatic ring and a derivative of a nitrogen-containing aromatic ring; and M is a central metal. The above-mentioned organic material is suitable for the EL device.

It is preferable in the above-mentioned first organic material for an EL device that the complex compound has a pyrazabole structure.

It is preferable in the above-mentioned organic material for an EL device that the complex compound is 4,4,8,8-tetrakis (1H-pyrazol-1-yl) pyrazabole.

Furthermore, a second organic material for an EL device of the present invention is an organic boron complex compound having an electron accepting phenyl group as a ligand.

It is preferable in the above-mentioned second organic material for an EL device that the boron organic complex compound is expressed by the formula (F2):

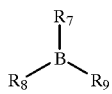

(F2)

wherein R7 to R9, which can be same or different, respectively denote an electron accepting phenyl group.

Furthermore, an EL device of the present invention includes an anode, a cathode and an organic compound layer placed between the anode and the cathode, and the organic compound layer includes the above-mentioned first organic material for the EL device. Thus, an EL device having an excellent property can be obtained.

It is preferable in the above-mentioned EL device that the organic material has a pyrazabole structure.

It is preferable in the above-mentioned EL device that the organic material is 4, 4, 8, 8-tetrakis (1H-pyrazol-1-yl) pyrazabole.

It is preferable in the above-mentioned EL device that the organic compound layer is a light emitting layer. With such a structure, an EL device having a high luminance can be obtained.

It is preferable in the above-mentioned EL device that the organic compound layer further includes at least one compound selected from the group consisting of a polycyclic aromatic hydrocarbon compound and a compound including nitrogen-containing aromatic ring having 5 or less carbon atoms. With such a structure, an EL device emitting various colors of light can be obtained.

It is preferable in the above-mentioned EL device that the organic compound layer further includes a compound having at least one ring structure selected from the group consisting of an anthracene ring and a phenanthrene ring. With such a structure, an EL device emitting various colors of light can be obtained.

It is preferable in the above-mentioned EL device that the organic compound layer further includes diphenylanthracene or a diphenylanthracene derivative. With such a structure, an EL device emitting various colors of light can be obtained.

It is preferable in the above-mentioned EL device that the organic compound layer further includes a compound having a ring structure that is the same as the ring structure of at least one member selected from the group consisting of pyrrole, imidazole, pyrazole, triazole, pyridine, pyridazine, pyrazine, pyrimidine, triazine, tetrazine, oxazole and oxadiazole. With such a structure, an EL device emitting various colors of light can be obtained.

It is preferable in the above-mentioned EL device that the peak of the photoluminescense of the compound is 580 nm or more and 680 nm or less. With such a structure, an EL device emitting orange to red light can be obtained.

It is preferable in the above-mentioned EL device that the organic compound layer further comprises an aromatic-substituted amine or a derivative thereof. With such a structure, an EL device having high luminance and emitting a blue light that has high color purity can be obtained.

It is preferable in the above-mentioned EL device that the organic compound layer further comprises an organic compound forming an exciplex with the organic material. With such a structure, an EL device having a high luminance and emitting various luminescent colors can be obtained.

It is preferable in the above-mentioned EL device that the organic compound is pyrene or a pyrene derivative. With such a structure, an EL device having a particularly high luminance can be obtained.

It is preferable that the above-mentioned EL device further includes a second organic compound layer placed between the cathode and the light emitting layer and that the second organic compound layer includes the above-mentioned first organic material for an EL device. With such a structure, an EL device, which is not effected by concentration quenching and which emits various colors of light, can be obtained.

It is preferable that the above-mentioned EL device further includes a hole transport layer between the anode and the light emitting layer. With such a structure, an EL device having a particularly high luminous efficiency can be obtained.

It is preferable in the above-mentioned EL device that the organic compound layer is an electron transport layer or an electron injection layer. With such a structure, an EL device having a particularly high luminous efficiency can be obtained.

It is preferable that the above-mentioned EL device further includes a light emitting layer between the organic compound layer and the anode.

It is preferable that the above-mentioned EL device further includes a hole transport layer between the light emitting layer and the anode. With such a structure, an EL device having a particularly high luminous efficiency can be obtained.

It is preferable in the above-mentioned EL device that the organic compound layer is an electron injection layer and the thickness of the organic compound layer is 0.2 nm to 2 nm. With such a structure, the organic compound layer works as an electron injection layer and an EL device having a particularly high luminous efficiency can be obtained.

It is preferable in the above-mentioned EL device that the concentration of the organic material contained in the organic compound layer increases toward the side of the cathode. With such a structure, an EL device having a particularly high luminous efficiency can be obtained.

It is preferable in the above-mentioned EL device that the cathode is made of a metal having a work function of 4.0 eV or more. With such a structure, the cathode is hardly deteriorated, so that an EL device having a long lifetime and high reliability can be obtained.

It is preferable in the above-mentioned EL device that the cathode is made of at least one metal selected from the group consisting of Al, Ag, In and Bi.

DETAILED DESCRIPTION OF THE INVENTION

Figure 1:
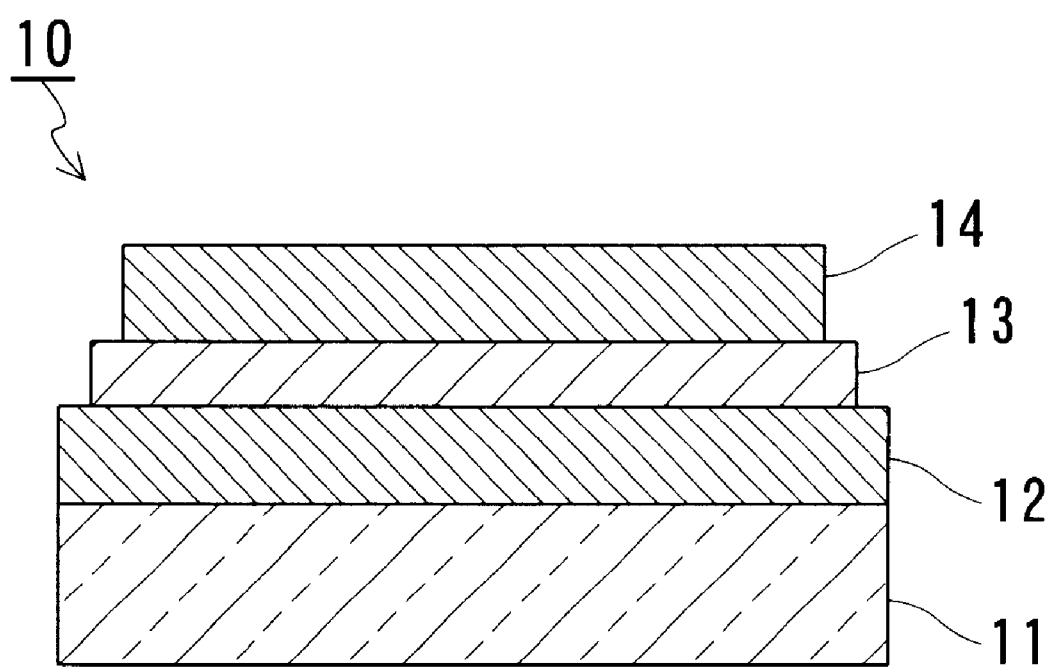
FIG. 1 is a sectional view showing an EL device of one example according to the present invention.

Hereinafter, the present invention will be described by way of embodiments with reference to drawings.

(First Embodiment)

In the first embodiment, an example of an organic material for an EL device according to the present invention is explained.

The organic material for an EL device of the first embodiment is a complex compound (organic polynuclear metal complex compound) expressed by the following formula (F1):

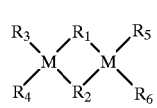

(F1)

wherein R1 and R2, which can be same or different, respectively denote one selected from the group consisting of halogen, alkyl having 1to 3 carbon atoms, and a bridging ligand having a nitrogen-containing aromatic ring containing at least two nitrogen atoms, and when R1 or R2 is a bridging ligand having a nitrogen-containing aromatic ring, nitrogen in the nitrogen-containing aromatic ring is a coordinating atom; R3, R4, R5 and R6, which can be same or different, respectively denote one member selected from the group consisting of hydrogen, alkyl, aryl, an aryl derivative, a nitrogen-containing aromatic ring and a derivative of a nitrogen-containing aromatic ring; and M is a central metal.

The complex compound expressed by the above-mentioned formula (F1) (hereinafter, referred to also as a complex compound (F1)) is a compound having two central metals M and ligands coordinating with the central metals M.

For the ligand R1 and R2, a bridging ligand having a nitrogen-containing aromatic ring containing at least two nitrogen atoms or a derivative thereof can be used, respectively. In this case, two nitrogen atoms in the nitrogen-containing aromatic ring are coordination atoms. Furthermore, it is preferable that two nitrogen atoms are coordinated with a plurality of central metals M, thereby forming a ring structure consisting of central metals and ligands. Since the nitrogen-containing aromatic ring has a strong aromatic property and the conjugate electrons are delocalized, the ligand having the nitrogen-containing aromatic ring forms a metal chelate bond via a strong covalent bond, thus forming a stable metal complex compound. The metal complex compound including the ligand having a nitrogen-containing aromatic ring frequently forms a complicated conformation and in turn has various molecular aggregation forms.

Examples of the nitrogen-containing aromatic ring containing at least two nitrogen atoms include, for example, pyrazole, pyridazine, naphthyridine, indazole, cinnoline, phthalazine, pteridine or phenanthroline. Examples of derivatives thereof include, for example, 3,5-dimethylpyrazole, 4-chloropyrazole, 4,7-diphenylphenanthroline, or the like.

Furthermore, for the ligands, R1 and R2, a bridging ligand having halogen or an alkyl group having 1 to 3 carbon atoms can be used. Specifically, for example, F, Cl, Br, I, a methyl group, an ethyl group, a propyl group, an isopropyl group, or the like, can be used.

The above-mentioned derivative of the nitrogen-containing aromatic ring is a nitrogen-containing aromatic ring further including a substituent of halogen, a methyl group, an ethyl group, a methoxy group, a phenyl group, and the like, and capable of maintaining the aromatic property of the nitrogen-containing aromatic ring.

For the metal element used for the central metal M, the metal element selected from the group consisting of Be, Mg, Ca, B, Al and Ga is preferred. Moreover, boron (B) is occasionally classified as a semimetal, but for purposes of in this specification, however, it is considered as a metal. An organic boron complex of compound having boron as the central metal M is stable even at a high temperature, because boron with small atomic radius is strongly bonded to the organic ligand. Therefore, in order to obtain an organic material for an EL device that is stable even at a high temperature as in the evaporation, it is preferable that the central metal M is boron.

R3 to R6 in the complex compound (F1) respectively denote one selected from the group consisting of hydrogen, alkyl, aryl, a nitrogen-containing aromatic ring and a derivative of a nitrogen-containing aromatic ring. Specifically, for example, a methyl group, an ethyl group, a phenyl group, a tolyl group, a naphthyl group, a biphenyl group, an anthranil group, a 9-phenylanthranil group or a pyrenyl group, or the like, can be used. Among the nitrogen-containing aromatic rings that can be used for R3 to R6, examples containing one nitrogen atom include pyrrole, pyridine, oxazole, and the like; examples containing two ore more nitrogen atoms include a nitrogen-containing aromatic ring having a ring structure that is the same as the ring structure of imidazole, pyrazole, pyridazine, pyrazine, pyrimidine, oxadiazole, triazole, triazine, tetrazine, tetrazole or phenanthroline. For example, 2,9-dimetylphenanthroline can be used. Furthermore, hetero-multiply condensed ring in which an aromatic ring is condensed to a nitrogen containing aromatic ring having 5 or less carbon atoms, for example, carbazole or benzimidazole, is also included in the nitrogen-containing aromatic ring having 5 or less carbon atoms of the present invention. Such a ring has the same effect as the above-mentioned nitrogen-containing aromatic ring.

The aryl derivative and the nitrogen containing aromatic ring derivative shown by R3 to R6 respectively denote an aryl derivative and nitrogen-containing aromatic ring derivative further including a substituent of halogen, a phenyl group, and the like, or denote a condensed ring, each of which can maintain the aromatic property of the above-mentioned aryl or nitrogen-containing aromatic ring.

It is preferable that the complex compound (F1) has a pyrazabole structure expressed by (A) in the following formula (F3).

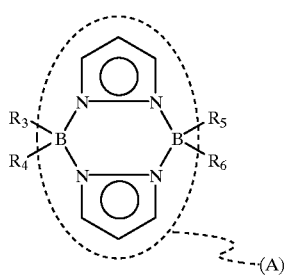

(F3)

Examples of the complex compound (F1) having a pyrazabole structure include the following compounds A-1 to A-6.

A-1: pyrazabole
A-2: 1,3,5,7-tetramethyl pyrazabole
A-3: 4,4,8,8-tetraethyl pyrazabole
A-4: 4,4,8,8-tetrakis (1H-pyrazol-1-yl) pyrazabole
A-5: 4, 4, 8, 8-tetrakis (1H-pyridazin-1-yl) pyrazabole
A-6: 4, 4, 8, 8-tetrakis (1H-benzimidazol-1-yl) pyrazabole The above A-1 to A-4 are available from Aldrich ACROS ORGANICS. The A-5 and A-6 can easily be synthesized from pyrazabole.

Specifically, A-5 and A-6 can be obtained by refluxing pyridazine or benzimidazole and trimethylamine borane in the ratio of 1:1 in toluene.

As one example, the structure of A-4 is expressed below in the structural formula (F4).

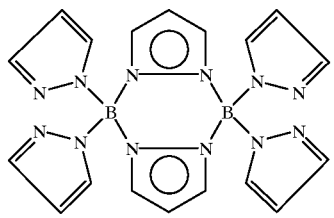

(F4)

The above-mentioned organic material for an EL device is suitable for material of the light emitting layer of the EL device. Furthermore, since the above-mentioned organic material for the EL device is an electron-deficient compound, it is also suitable for the material for the electron transport layer or the electron injection layer of the EL device.

Hereinafter, the electron-deficient compound is explained. The bond between neutral molecules is usually explained by "Lewis-Langmuir's theory of valency," i.e.

"octet theory." However, an atom without having sufficient valence electrons cannot satisfy the octet theory. The electron-deficient compound does not have sufficient valence electrons for the valence orbits and does not satisfy the octet theory. Elements constituting the electron-deficient compound include Li, Be, Mg, B, Zn and Al. An example of the inorganic compound includes LiH, BeH$_2$, and the like; and an example of the organic compound includes a compound forming a three-center bond, for example, an alkylated aluminum etc. The present inventors found that the electron-deficient compound forming a three-center bond is suitable for the organic material for the EL device. Since these complex compounds are deficient in electrons, they become stable by obtaining electrons. That is, since the complex compound (F1) can be present stably in an anionic state, the electron transport property can be maintained. Furthermore, since the complex compound (F1) is an organic metal complex compound, it has an excellent thermal property and excellent film quality and it makes it possible to form a thick film. Therefore, the above-mentioned complex compound (F1) can form an electron transport layer capable of transporting electrons.

Furthermore, the electron-deficient compound does not complete a closed shell, so that it has a strong electron accepting property and it is also suitable for the electron injecting material. In particular, by using the electron injection layer made of the organic compound such as the complex compound (F1), the bonding between the electron injection layer and the organic light emitting layer is improved, and thus the electron injection property and stability are improved. Furthermore, when these compounds are used for the electron transport layer, the electron transport layer working also as the electron injection layer can be obtained.

In the first embodiment, the above-mentioned alkyl group preferably has 1 to 8 carbon atoms. In the first embodiment, the above-mentioned aryl group preferably has 1 to 30 carbon atoms.

In another aspects of this invention, this invention relates to the use of the above-mentioned organic materials for the EL devices.

(Second Embodiment)

In the second embodiment, another example of organic materials for an EL device according to the present invention is explained.

The organic material for an EL device of the second embodiment is an organic boron complex compound having an electron accepting phenyl group as a ligand. An example of the boron complex compound is, for example, a complex compound expressed by the following formula (F2).

(F2)

wherein R7 to R9, which can be same or different, respectively denote an electron accepting phenyl group.

The electron accepting phenyl group that can be used for R7 to R9 includes a phenyl group substituted by an electron accepting group such as a halogen, a cyano group, a nitro group, a carbonyl group and the like. The above-mentioned complex compound (F2) has an electron accepting aromatic ring in a ligand forming a stable organic boron complex compound, thus forming an excellent fluorescent light emitting film.

An example of the organic boron complex compound having a ligand that is a phenyl group substituted by halogen, for example, an organic boron complex salt having a tetrakis (halophenyl) borate structure. An example of the organic boron complex salt having a tetrakis (halophenyl) borate structure is potassium tetrakis (4-clorophenyl) borate expressed by the following formula (F5).

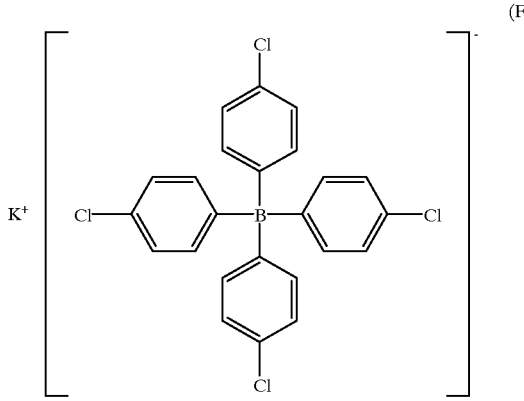

(F5)

As a halogen element used for tetrakis (halophenyl) borate, fluorine has the highest electron accepting property and is also chemically stable. A specific example includes, for example, magnesium tetrakis(4-fluorophenyl) borate.

Thus, the organic material for an EL device of the second embodiment can provide a high luminance and various luminescent colors.

In the second embodiment, the above-mentioned alkyl group preferably has 1 to 8 carbon atoms. In the second embodiment, the above-mentioned aryl group preferably has 1 to 30 carbon atoms.

In another aspects of this invention, this invention relates to the use of the above-mentioned organic materials for the EL devices.

(Third Embodiment)

In the third embodiment, an example of EL devices according to the present invention is explained.

FIG. 1 is a sectional view showing an EL device 10 of the third embodiment. Referring to FIG. 1, the EL device 10 includes a translucent substrate 11, and an anode 12, a light emitting layer 13 and a cathode 14, which are sequentially laminated in that order on the translucent substrate 11. That is, the light emitting layer 13 is placed between the anode 12 and the cathode 14.

For the translucent substrate 11, a material capable of supporting the anode 12 etc. and transmitting light from the light emitting layer 13 can be used. Specifically, for example, a glass such as Corning 1737 etc. or a resin film made of polyester or the like can be used.

The anode 12 is an electrode for injecting holes. For the anode 12, a transparent electrode film such as ITO (Indium Tin Oxide) or $SnO_2$ and the like can be used. Also, a thin film made of a metal such as Ni, Au, Pt, Pd or the like can be used. The thickness of the anode 12 is determined by taking into account a sheet resistance value and transmittance of visible light. Usually, the thickness is made to be 100 nm or more in order to reduce the sheet resistant value. The anode 12 can be formed by, for example, a sputtering method, an electron-beam evaporation, ion plating, and the like.

The cathode 14 is an electrode for injecting electrons. The cathode 14 can be formed, for example, by laminating a metal film made of an alkali metal or an alkaline earth metal and a stable metal film made of aluminum or silver, etc. The cathode 14 can be formed by, for example, an evaporation method or a sputtering method.

The light emitting layer 13 is an organic compound layer and includes the organic material for an EL device described in the first embodiment. That is, the light emitting layer 13 includes a complex compound (F1). The complex compound (F1) preferably has a pyrazabole structure. Specifically, A-1 to A-6 described in the first embodiment can be used for the complex compound (F1). Among these complex compounds, the light emitting layer 13 preferably includes A-4.

It is preferable that the light emitting layer 13 includes, along with the complex compound (F1), at least one compound selected from the group consisting of a polycyclic aromatic hydrocarbon compound and a compound having a nitrogen-containing aromatic ring having 5 or less carbon atoms. When the light emitting layer 13 further includes these compounds, an EL device emitting various colors of light can be obtained.

For the polycyclic aromatic hydrocarbon compound (polycyclic aromatic hydrocarbon or a derivative thereof), a polycyclic aromatic hydrocarbon or a derivative thereof having one ring structure selected from the group consisting of an anthracene ring and a phenanthrene ring can be used. Specifically, for the derivative of the polycyclic aromatic hydrocarbon, it is possible to use a derivative of rubrene, decacyclene, diphenylanthracene, dibenzanthracene, pentacene, dibenzpentacene, bis(phenylethynyl) anthracene, bis(phenylethynyl) naphthacene, pentaphenyl cyclopentadiene and tetraphenyl cyclopentadiene.

The derivative of polycyclic aromatic hydrocarbon is a polycyclic aromatic hydrocarbon with which a benzene ring is condensed or one including a substituent of a methyl group, an ethyl group, a methoxy group, a phenyl group, a styryl group, and the like, and which can maintain the high quantum yield of polycyclic aromatic hydrocarbon.

When the light emitting layer 13 includes the complex compound (F1) having a pyrazabole structure, and further includes diphenylanthracene or a derivative thereof, which is a polycyclic aromatic hydrocarbon derivative, an organic EL device having particularly high luminance can be obtained. Specifically, the light emitting layer may include 9,10-diphenylanthracene or 9,10-bis(4-methoxyphenyl) anthracene.

Diphenylanthracene derivative improves the electron density of diphenylanthracene by providing an electron donor group of halogen, a methyl group, a methoxy group, and the like.

Furthermore, the compound having a nitrogen containing aromatic ring having 5 or less carbon atoms is, for example, a compound having the same ring structure as the ring structure of one selected from the group consisting of pyrrole, imidazole, pyrazole, triazole, pyridine, pyridazine, pyrazine, pyrimidine, triazine, tetrazine, oxazole and oxadiazole. Specifically, for example, 2,4-bis(5,6-diphenyl-1,2,4-triazine-3-yl)pyridine, 3-(2-pyridyl)-5,6-diphenyl-1,2,4-triazine, 5,6-di-2-furyl-3-(2-pyridyl)-1,2,4-triazine, 3-(4-biphenylyl)4-phenyl-5-(4-tert-butylphenyl) 1,2,4-triazole can be used. Each of these organic molecules emits weak blue fluorescent light by itself. However, by including these organic molecules with the above-mentioned complex compounds having a pyrazabole structure, an organic EL device can emit orange to red light with high intensity. Furthermore, by including a nitrogen-containing aromatic ring compound, which has a peak wavelength of photoluminescence of 580 nm or more 680 nm or less, in the light emitting layer, an organic EL device can emit orange to red light.

It is preferable that the light emitting layer 13 further includes, along with the complex compound (F1), an aromatic-substituted amine or a derivative thereof. By including such compounds with the complex compound (F1), an organic EL device can emit various colors of light.

For the aromatic-substituted amine or a derivative thereof, triphenylamine, a compound expressed by the following formula (F6) or a compound expressed by the following formula (F7) can be used.

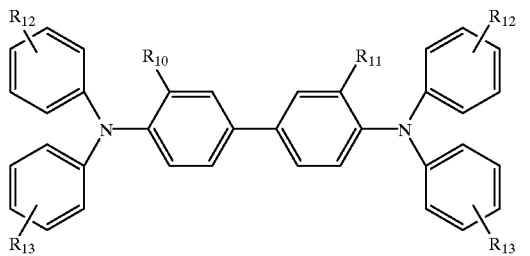

(F6)

wherein R10 and R11, which can be same or different, respectively denote one selected from the group consisting of hydrogen, a methyl group, a methoxy group and Cl; and R12 and R13, which can be same or different, respectively denote one selected from the group consisting of hydrogen, an alkyl group, an alkoxy group, a phenyl group and a phenyl group substituted by an alkyl group or an alkoxy group.

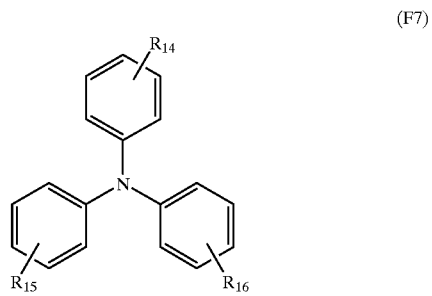

(F7)

wherein at least one of R14, R15 and R16 is styryl, phenylstyryl, naphthylstyryl, or a derivative thereof substituted by an alkyl group, an amino group or a phenyl group; and R14, R15 and R16 other than the above are respectively made of an alkyl group, an amino group, phenyl group, alykyl-substituted benzene, or amino-substituted benzene.

Specifically, for the compound (F6), N,N'-diphenyl-N,N'-bis(3-methylphenyl)-1,1'-biphenyl-4,4'-diamine, N,N'-diphenyl-N,N'-binaphthyl-1,1'-biphenyl-4,4'-diamine, N,N'-bis(4'-diphenylamino-4-biphenylyl)-N,N'-diphenylbenzidine, and the like, can be used. Furthermore, for the compound (F7), it is possible to use 4-N,N'-diphenylamino-α-phenylstilbene, 4-N,N'-bis(p-methylphenyl)amino-α-phenylstilbene, 4-N,N'-diphenylamino-α-naphthylstilbene, 4,4'-bis(α-phenylstyryl)triphenylamine, 4,4',4"-tri(α-phenylstyryl)triphenylamine, 4,4'-bis(3-methylphenylstyryl)triphenylamine, 4,4'-bis(2,4-dimethylphenylstyryl)triphenylamine, 4,4'-bis(α-biphenylstyryl)triphenylamine, and the like. These compounds emit blue light having a peak between 430 nm and 490 nm in a solution or in a state of thin film. It is preferable that the light emitting layer 13 includes the complex compound (F1) and aromatic-substituted amine (or a derivative thereof) and the amount of the aromatic-substituted amine (or a derivative thereof) is in the range from 1 wt % to 50 wt %.

Moreover, the above-mentioned EL device 10 is just an example. Therefore, other embodiments may be employed as long as the EL device has the light emitting layer 13. Other examples of such EL devices are shown in FIGS. 2 to 8.

Figure 2:
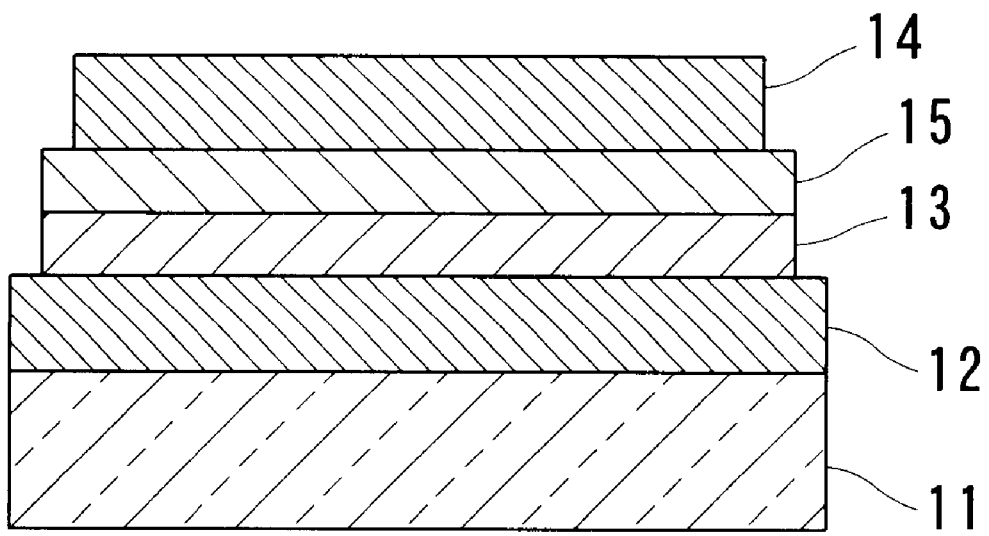
FIG. 2 is a sectional view showing an EL device of another example according to the present invention.
Figure 3:
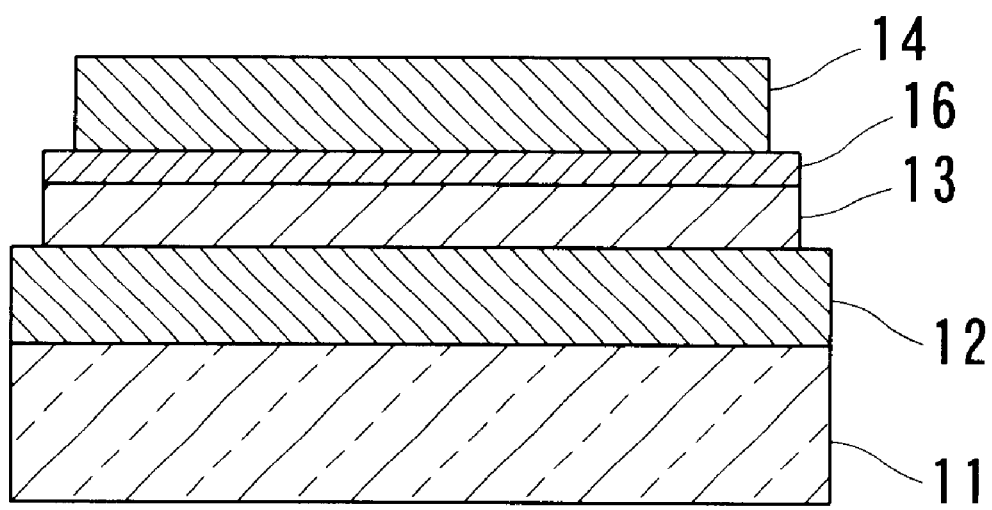
FIG. 3 is a sectional view showing an EL device of a further example according to the present invention.
Figure 4:
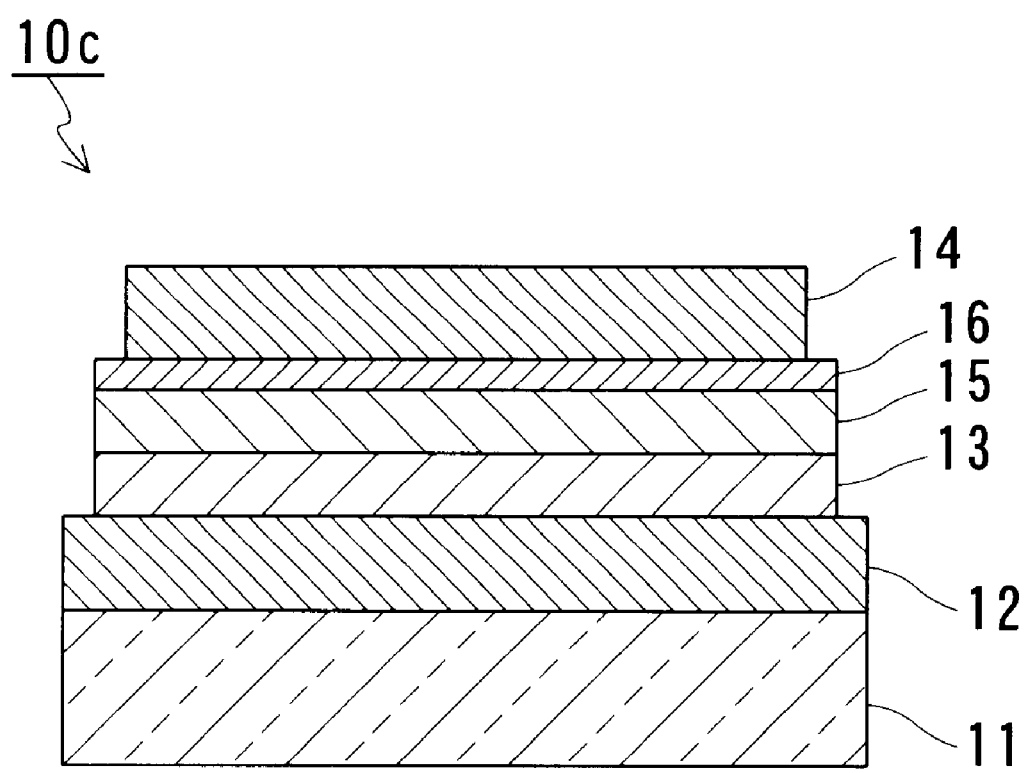
FIG. 4 is a sectional view showing an EL device of a further example according to the present invention.
Figure 5:
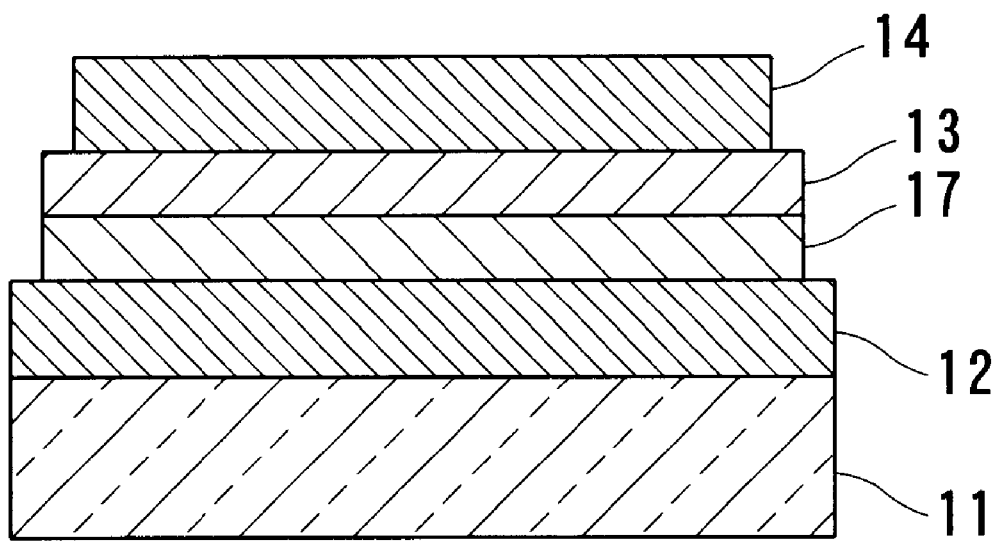
FIG. 5 is a sectional view showing an EL device of a further example according to the present invention.
Figure 6:
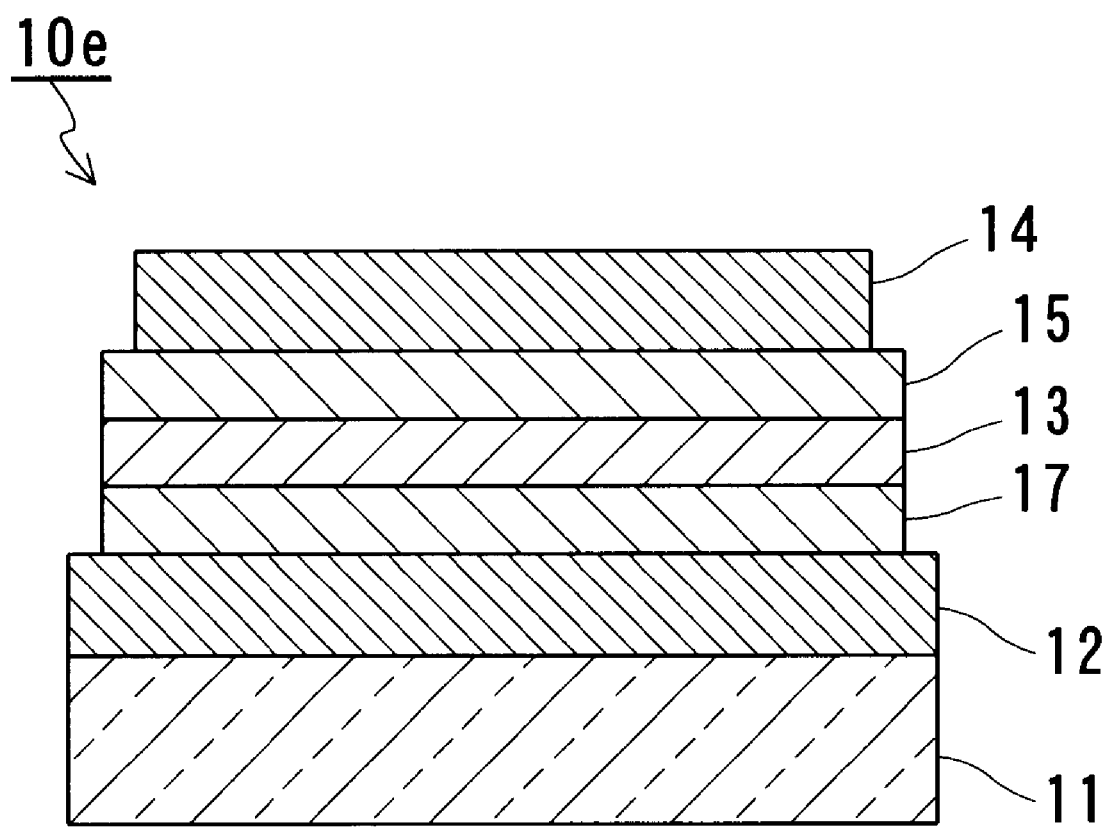
FIG. 6 is a sectional view showing an EL device of a further example according to the present invention.
Figure 7:
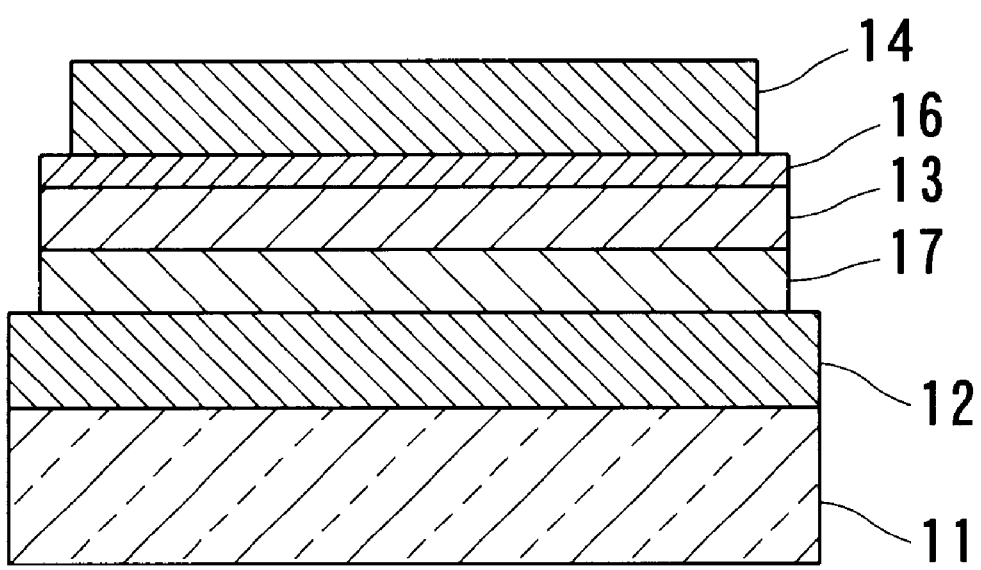
FIG. 7 is a sectional view showing an EL device of a further example according to the present invention.
Figure 8:
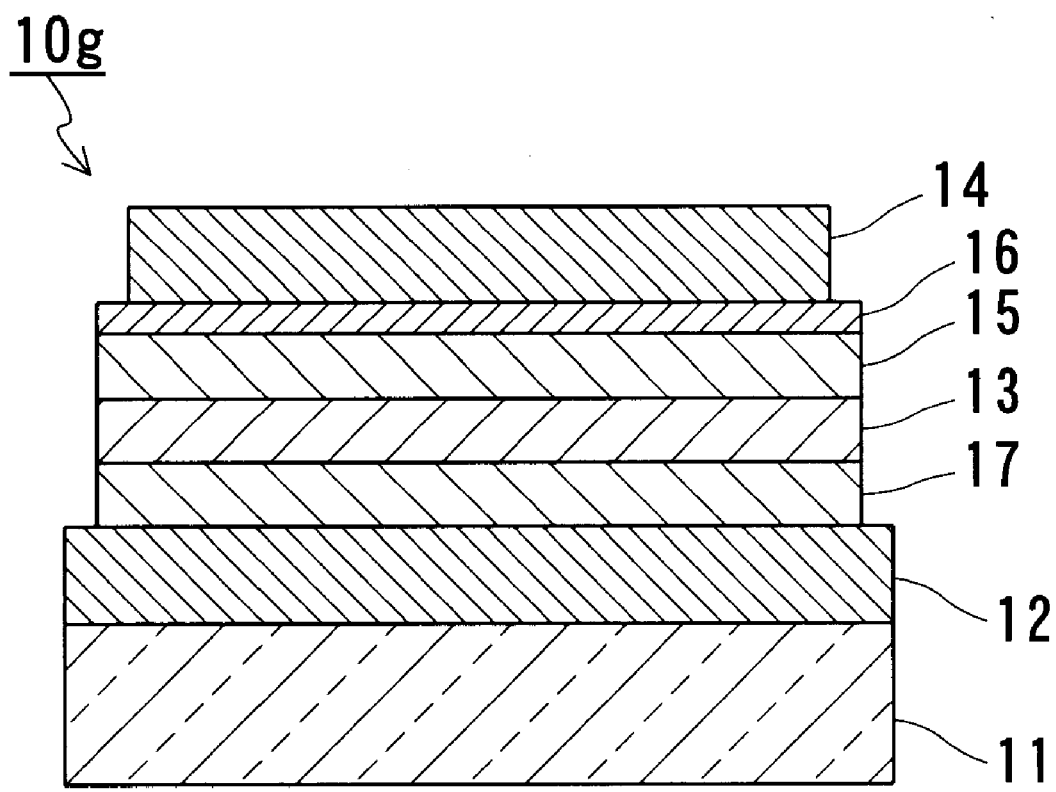
FIG. 8 is a sectional view showing an EL device of a further example according to the present invention.

The EL device 10a of FIG. 2 further includes an electron transport layer 15 between the light emitting layer 13 and the cathode 14, in addition to the structure of the EL device 10. The EL device 10b shown in FIG. 3 further includes an electron injection layer 16 between the light emitting layer 13 and the cathode 14, in addition to the structure of the EL device 10. The EL device 10c shown in FIG. 4 further includes an electron transport layer 15 and an electron injection layer 16 between the light emitting layer 13 and the cathode 14, in addition to the structure of the EL device 10. The electron transport layer 15 and the electron injection layer 16 are sequentially laminated on the light emitting layer 13 in that order from the side of the light emitting layer 13. Moreover, the EL devices 10 and 10a to 10c may further include a hole transport layer 17 between the cathode 12 and the light emitting layer 13. The embodiments in which the EL devices 10, 10a, 10b, and 10c further include a hole transport layer 17 are shown in FIG. 5 (an EL device 10d), FIG. 6 (an EL device 10e), FIG. 7 (an EL device 10f) and FIG. 8 (an EL device 10g), respectively.

Since the translucent substrate 11, an anode 12, a light emitting layer 13 and a cathode 14 in the EL devices 10a to 10g are the same as those of the EL device 10, the explanation thereof will be herein omitted.

For the electron transport layer 15, for example, tris(8-quinolinolato) aluminum (hereinafter, referred to also as Alq), tris(4-methyl-8-quinolinolato) aluminum or 3-(2'-benzothiazolyl)-7-diethylaminocoumarin, or the like, can be used. In other words, for the electron transport layer 15, an organic compound having a higher energy level of LUMO (Lowest Unoccupied Molecular Orbital) than the compound constituting the light emitting layer 13, or an inorganic compound having a smaller electron affinity than the compound constituting the light emitting layer 13 can be used. The thickness of the electron transport layer 15 is preferably in the range from 10 nm to 1000 nm.

For the electron injection layer 16, for example, an inorganic compound such as LiF, Li$_2$O or CaO, or an organic compound such as 8-quinolinolato lithium, tetrapyridylporphine cobalt, or the like can be used. In other words, for the electron injection layer 16, an inorganic compound having a smaller electron affinity than the compound constituting the light emitting layer 13, or an organic compound having a higher energy level of LUMO than the compound constituting the light emitting layer 13 can be used. Moreover, when the electron transport layer 15 and the electron injection layer 16 are laminated, a material capable of injecting electrons into the electron transport layer 15 is used for the electron injection layer 16.

It is preferable that the hole transport layer 17 uses a derivative based on triphenylamine. Specifically, for example, tetraphenylbenzidine compound, triphenylamine trimer or benzidine dimer can be used (see Publication of Japanese Patent Application No. Hei 7-126615 A). Furthermore, a triphenyldiamine derivative (Publication of Japanese Patent Application No. Hei 8-48656A) or MTPD (Publication of Japanese Patent Application No. Hei 7-65958A) may be used. Above all, triphenylamine tetramer (Japanese Patent Application No. 9-341238) is preferred.

Moreover, in a case where each of the light emitting layer 13, the electron transport layer 15, the electron injection layer 16 and the hole transport layer 17 is made of an organic compound, it is preferable that each layer is amorphous and homogeneous. In order to form such a homogeneous layer, each layer is preferably formed by a vacuum evaporation method. In particular, by forming each layer continuously in a vacuum, impurities can be prevented from attaching to the interface between layers. Thus, the properties such as operating voltage, luminous efficiency and lifetime can be improved. Furthermore, when one layer made of a plurality of compounds is formed by the vacuum evaporation method, it is preferable to use a plurality of boats, each of which contains a compound to be individually co-deposited by controlling the temperatures, respectively. A mixture in which a plurality of compounds were previously mixed may be heated in one boat and deposited. Furthermore, the other film forming methods include a solution application method, and LB (Langmuir-Blodgett technique) may be employed. In the solution application method, for example, each compound may be applied by dispersing each compound in a matrix material such as polymer, etc.

(Fourth Embodiment)

In the fourth embodiment, another example of EL devices according to the present invention is explained.

Figure 9:
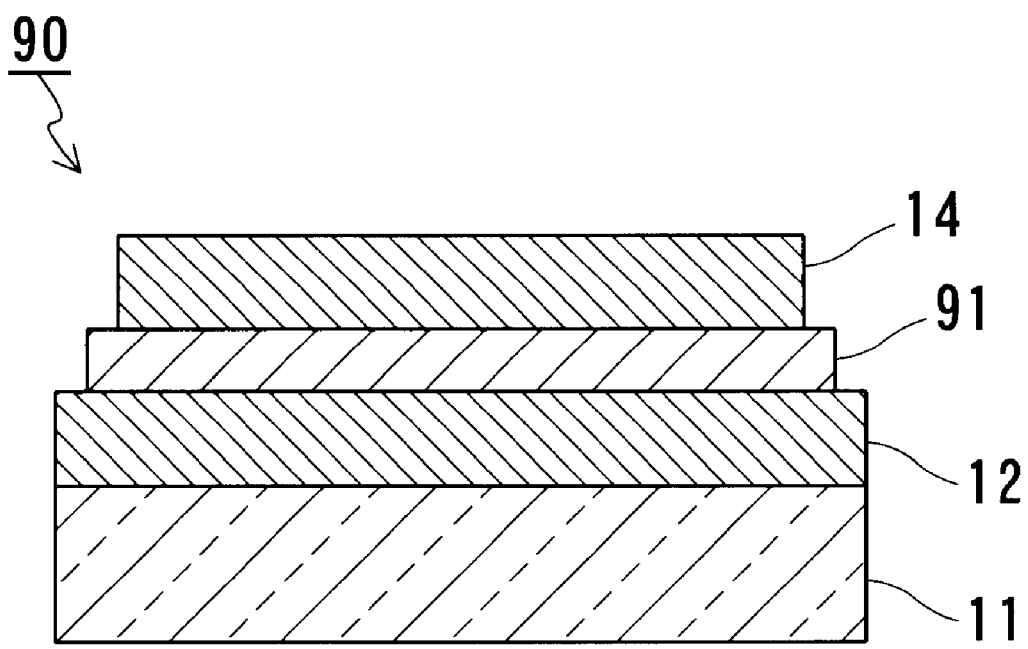
FIG. 9 is a sectional view showing an EL device of a further example according to the present invention.

FIG. 9 is a sectional view showing an EL device 90 of the fourth embodiment. The EL device 90 includes a translucent substrate 11, an anode 12, a light emitting layer 91 and a cathode 14, which are sequentially laminated in that order on the translucent substrate 11. Explanation of the parts explained in the third embodiment is omitted herein.

The light emitting layer 91 includes at least two kinds of organic compounds, and the two kinds of organic compounds form an exciplex.

It is preferable that the complex compound (F1) of the first embodiment is used as the organic compound forming the exciplex. Further, it is preferable that the complex compound (F1) has a pyrazabole structure. Specifically, A-1 to A-6 explained in the first embodiment can be used. Above all, the light emitting layer 91 preferably includes A-4.

When the light emitting layer 91 includes the complex compound (F1), the light emitting layer 91 further includes an organic compound forming an exciplex with a complex compound (F1). For such an organic compound, for example, pyrene or pyrene derivative can be used. In particular, it is preferable that the light emitting layer 91 includes a complex compound (F1) and pyrene (or pyrene derivative) and the amount of pyrene (or pyrene derivative) is in the range from 1 wt % to 50 wt %.

The pyrene derivative can maintain the high quantum yield of pyrene.

For the pyrene derivative, specifically, 1-pyrenemethylamine, phenyl styrylpyrene, N-(1-pyrenyl) maleimide and the like can be used. The pyrene and pyrene derivative emits a blue-green light having a peak at about 500 nm in a solution or in a form of film. However, when the pyrene (or a pyrene derivative) and a complex compounds A-1 to A-6 having a pyrazabole structure are present together, light emission from pyrene (or a pyrene derivative) is not observed and blue light (peak wavelength of about 460 nm) is shown based on the formation of the exciplex. The luminescence based on the exciplex has extremely high luminous efficiency, which is about 10 times the case where the complex compound (F1) singly forms the light emitting layer.

Pyrene and a pyrene derivative are excellent EL materials having an extremely high quantum efficiency. However, since there are not appropriate host materials in the conventional doping method, performance as to the EL material cannot be brought out. In the present invention, by using the combination of the complex compound (F1) and pyrene derivative, light emission from the exciplex can be obtained.

Moreover, as shown in EL devices 10a to 10g shown in FIGS. 2 to 8, the EL device 90 of the fourth embodiment may further include a hole transport layer, an electron transport layer and an electron injection layer. For the hole transport layer, the electron transport layer and the electron injection layer, the materials explained in the fourth embodiment can be used.

When the EL device 90 further includes the electron transport layer or the electron injection layer, these layers preferably include the complex compound (F1) explained in the first embodiment. Further, it is preferable that the complex compound (F1) included in these layers have a pyrazabole structure. Specifically, A-1 to A-6 explained in the first embodiment can be used.

In the EL device 90 of the fourth embodiment, two kinds of organic compounds forming exciplex in the light emitting layer 91 are different from usual dopants and are not required to have the luminescent peak that is intended. Therefore, the overlapping of spectra necessary for energy transfer are not required and so there is no interaction of materials or concentration quenching due to a wide range of π electron system of dye. For example, Publication of Japanese Patent Application No. Hei 10-159076 A discloses the EL device provided with a blocking layer between the electron transport layer and the hole transport layer in order to prevent the shift from the original luminescent color of the dopant. However, the EL device 90 does not need such a blocking layer. The EL device 90 forms the exciplex in the light emitting layer and emits light from the exciplex. That is, even if an individual organic molecule has a small fluorescent intensity, by forming the exciplex with these molecules, it is possible to produce a new electron state and to achieve a strong luminescence. Furthermore, the exciplex is formed not only in the case where entire molecules are interacted with each other but also in the case where an electron acceptor part or an electron donor part in each molecule are interacted with each other. Therefore, by finding the combination thereof, an EL device with high luminescence and various colors can be obtained.

(Fifth Embodiment)

In the fifth embodiment, another example of an EL device according to the present invention is explained.

Figure 10:
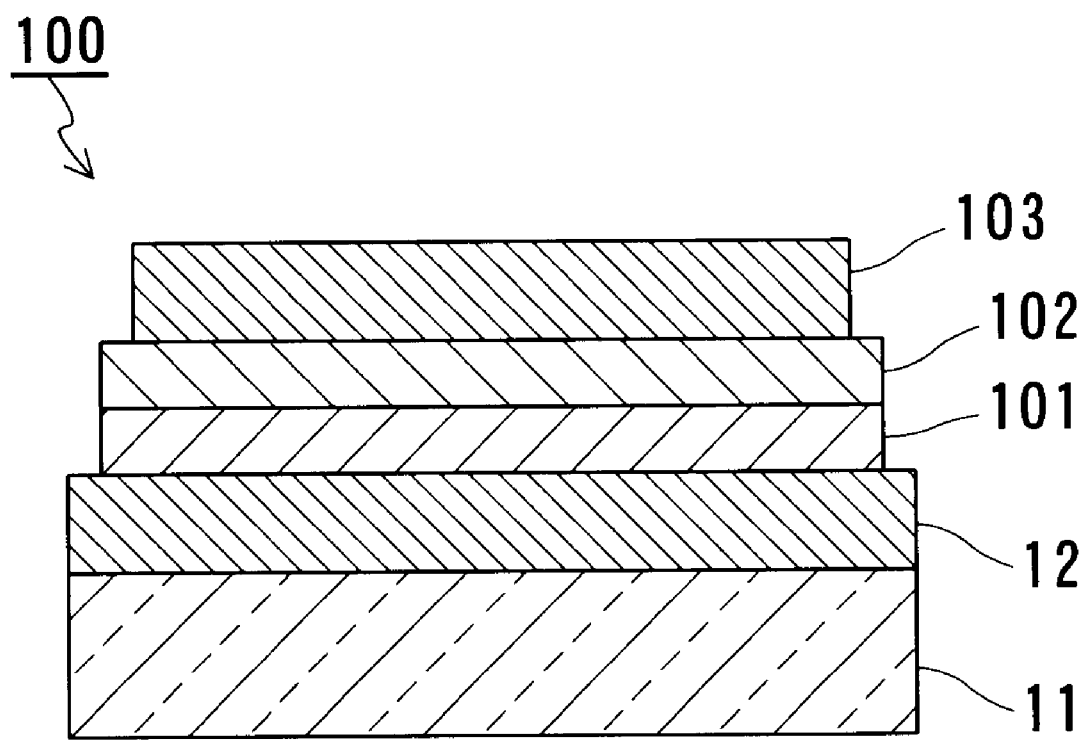
FIG. 10 is a sectional view showing an EL device of a further example according to the present invention.
Figure 11:
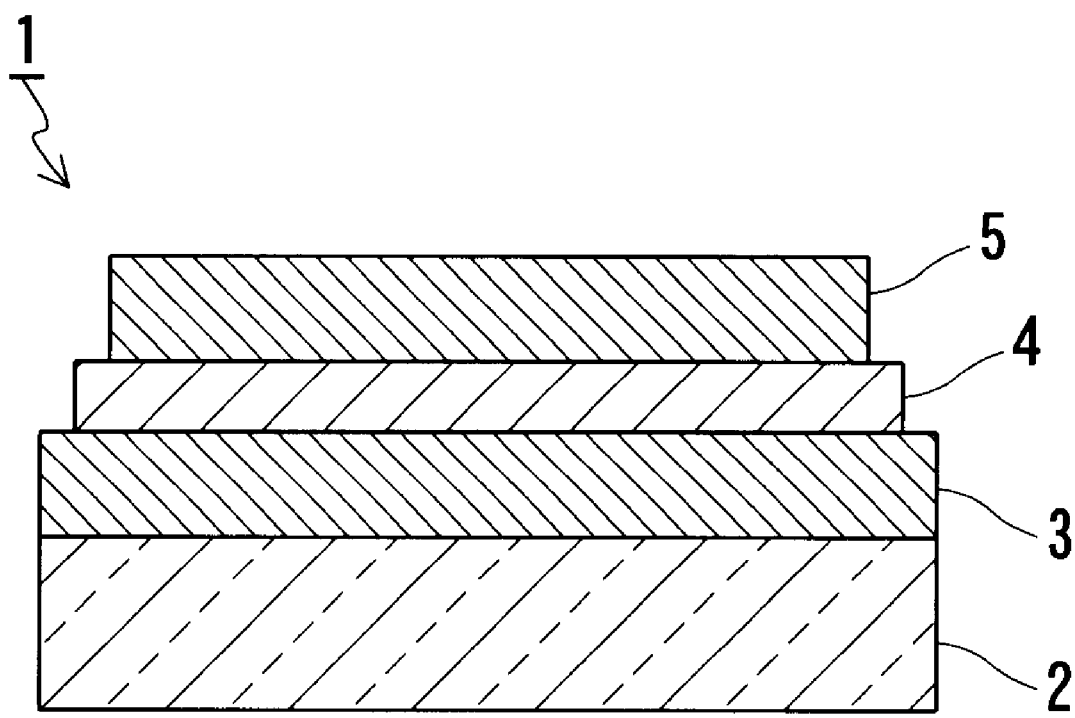
FIG. 11 is a sectional view showing an EL device of an example of the prior art.
Figure 12:
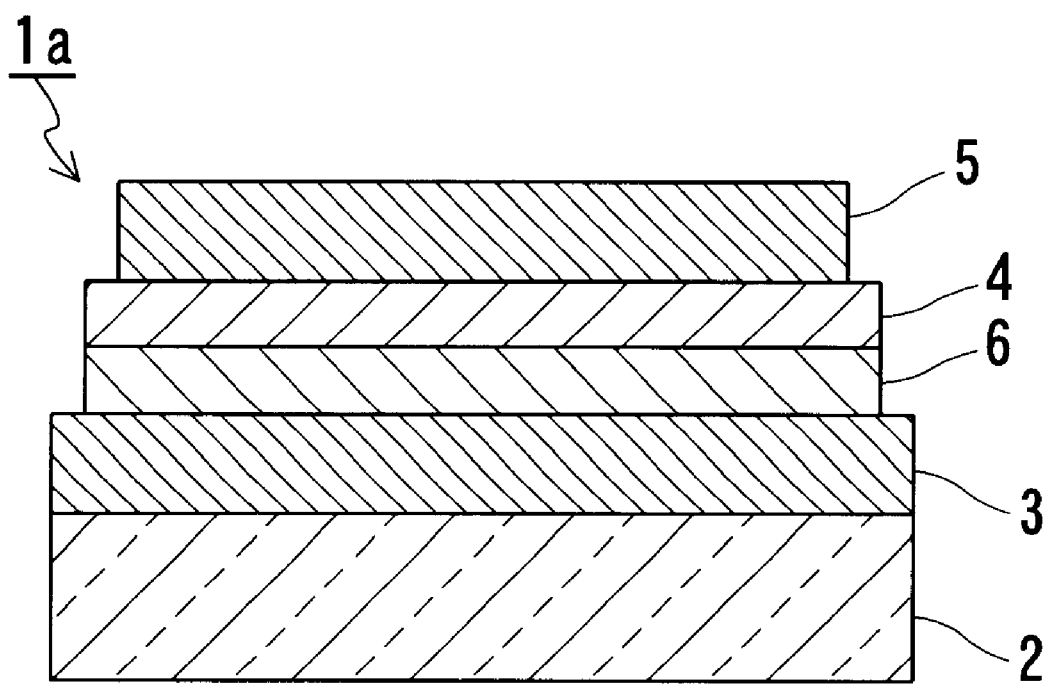
FIG. 12 is a sectional view showing an EL device of an example of the prior art.
Figure 13:
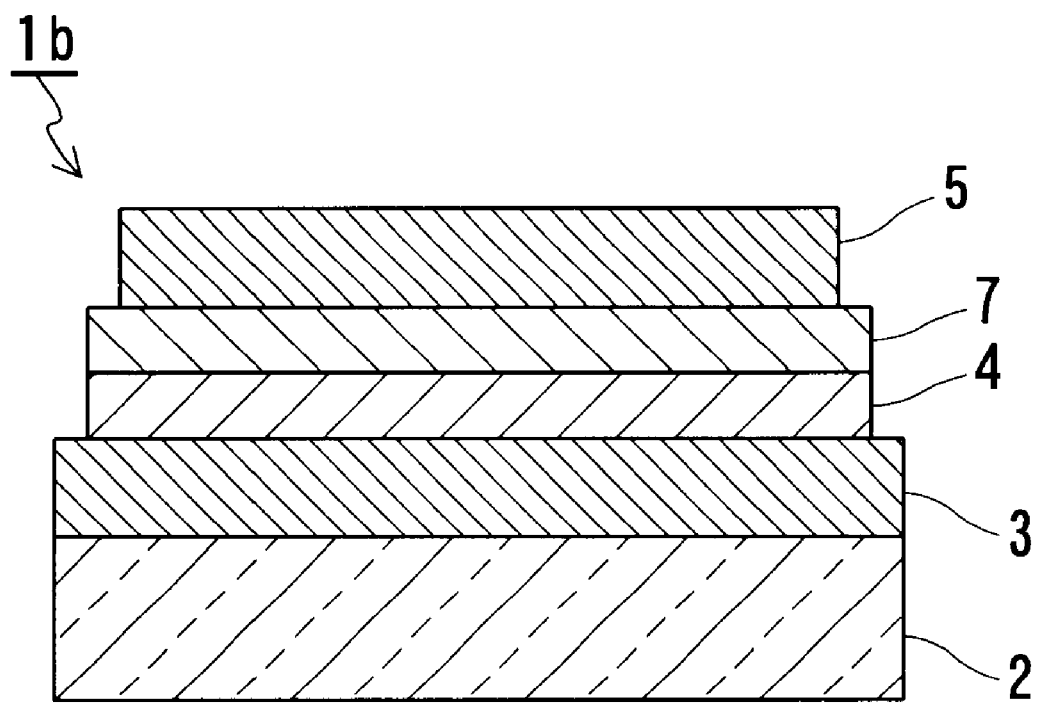
FIG. 13 is a sectional view showing an EL device of an example of the prior art.
Figure 14:
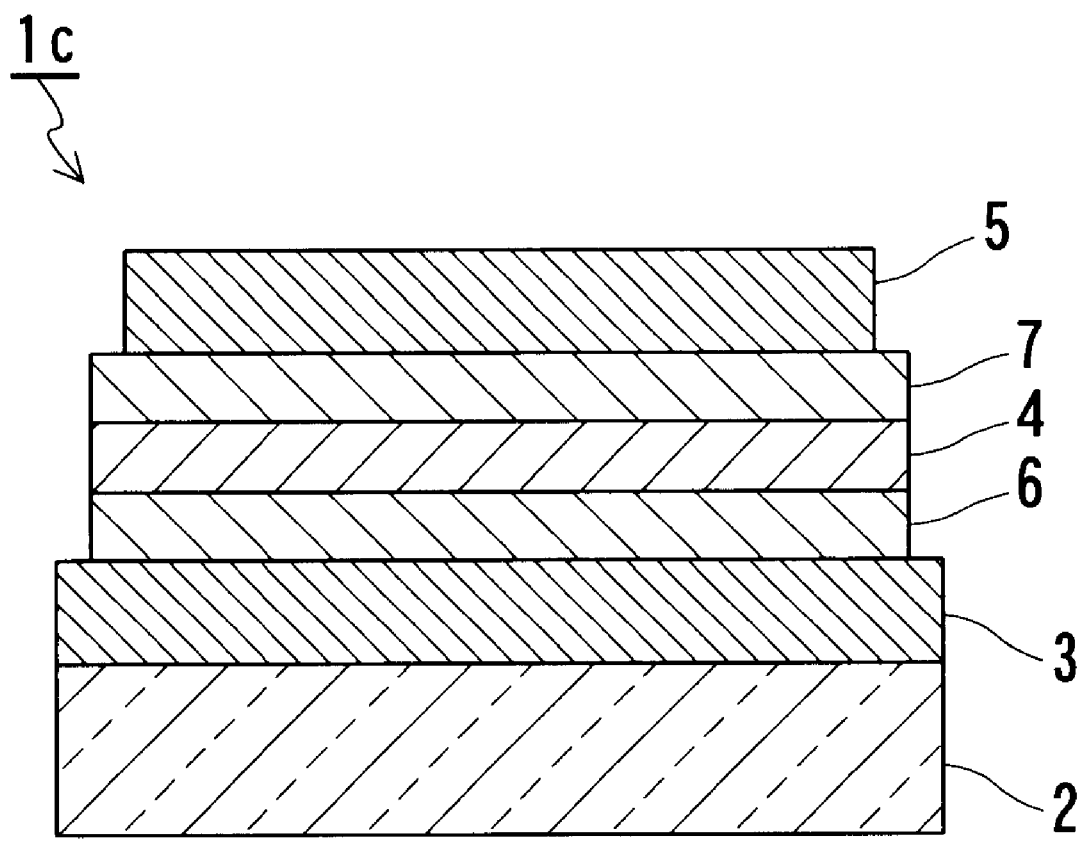
FIG. 14 is a sectional view showing an EL device of an example of the prior art.

FIG. 10 is a sectional view showing an EL device 100 of the fifth embodiment. The EL device 100 includes a translucent substrate 11, an anode 12, a light emitting layer 101, an organic compound layer 102 and a cathode 103, which are sequentially laminated on the translucent substrate 11 in that order.

For the light emitting layer 101, an organic compound having a narrower band-gap than that forming the organic compound layer 102 can be used. Specifically, for example, Alq or a derivative thereof can be used. Moreover, for Alq or a derivative thereof which is doped with a dye such as coumarin 6, a dicyanomethylene derivative (commercial name: DCM, produced by LAMBDA PHYSIK) or phenoxazone 9 may be used for the light emitting layer 101. Furthermore, for the light emitting layer 101, tirphenylamine doped with rubrene may be used. Furthermore, the light emitting layer 101 may be formed by a material having a hole transport property and a hole block layer of bathocuproin etc. may be formed at the interface between the light emitting layer 101 and an electron transport layer. Moreover, since the complex compound (F1) emits violet light by itself, by using an appropriate material for the light emitting layer 101, it is possible to obtain an EL device that emits light having a longer wavelength than the violet light.

The organic compound layer 102 includes the complex compound (F1) explained in the first embodiment. The complex compound (F1) included in the organic compound layer 102 preferably has a pyrazabole structure. Specifically, A-1 to A-6 of the first embodiment can be used. Above all, an organic compound layer 102 is preferably includes A-4.

When the thickness of the organic compound layer 102 is large, the organic compound layer 102 works as an electron transport layer. Furthermore, when the thickness of the organic compound layer 102 is thin, the organic compound layer 102 works as the electron transport layer. When the organic compound layer 102 is the electron transport layer, the thickness of the organic compound layer 102 is preferably in the range from 10 nm to 1000 nm. When the organic compound layer 102 is the electron injection layer, the thickness of the organic compound layer 102 is preferably in the range from 0.1 nm to 5 nm, more preferably in the range from 0.2 nm to 2 nm.

It is preferable that the organic compound layer 102 includes the complex compound (F1) in the amount of 0.1 wt % to 99.9 wt %. In particular, it is preferable that the organic compound layer 102 includes the complex compound (F1) in the amount of 50 wt % to 99.9 wt % in about one-third part of the organic compound layer 102 at the side of the cathode. The organic compound layer 102 may include the complex compound (F1) uniformly over the entire layer. Also, the organic compound layer 102 may include the complex compound (F1) so that the concentration of the complex compound (F1) increases toward the side of the cathode 103.

For the cathode 103, besides materials usually used for cathodes (the material explained as to the cathode 14 of the third embodiment), a stable metal having a work function of 4.0 eV or more can be used. Examples of such a metal include, for example, Al, Ag, In and Bi. Therefore, it is preferable that the cathode 103 is made of at least one metal selected from the group consisting of Al, Ag, In and Bi. The thickness of the cathode 103 is preferably in the range from 10 nm to 1000 nm.

Moreover, the EL device 100 is not limited to the configuration shown in FIG. 10. For example, the EL device 100 may include a hole transport layer or a hole injection layer between the anode 12 and the light emitting layer 101. Furthermore, when the organic compound layer 102 is the electron injection layer, the EL device 100 may further include an electron transport layer between the light emitting layer 101 and the organic compound layer 102. Furthermore, when the organic compound layer 102 is the electron transport layer, the EL device 100 may further include an electron injection layer between the organic compound layer 102 and the cathode 103.

The above-mentioned EL device 100 of the fifth embodiment includes an organic compound layer 102 between a light emitting layer 101 and the cathode 103, and the organic compound layer 102 includes the complex compound (F1) explained in the first embodiment. As explained in the first embodiment, the complex compound (F1) is a stable material suitable for the electron transport layer or the electron injection layer. For example, unlike the PBD film, the complex compound (F1) is not crystallized even if it is exposed to the atmosphere for the long time. Accordingly, by using the complex compound (F1), an EL device having high reliability can be obtained. Furthermore, in the EL device 100, when both the light emitting layer 101 and the electron injection layer (or the electron transport layer) are made of an organic compound, unlike the case where the electron injection layer (or the electron transport layer) are made of inorganic compound, the compatibility at the bonding interface is improved, thus improving the electron injection property. Therefore, with the EL device 100, an EL device having a high luminous efficiency and long lifetime can be obtained.

Furthermore, in the EL device 100, when the stable metal having a work function of 4.0 eV or more is used for the cathode 102, the EL device having a long lifetime and high reliability can be obtained.

EXAMPLE

Hereinafter, the specific example in which the EL device according to the present invention using A-1 to A-6 explained in the first embodiment will be explained.

Example 1

In Example 1, first, an ITO film working as an anode was formed on a glass substrate. Then, a hole transport layer (thickness: 50 nm) made of N,N'-bis(4'-diphenylamino-4-biphenylyl)-N,N'-diphenylbenzidine (hereinafter, TPD will be also referred to) was deposited onto the ITO film. Thereafter, A-4 (thickness: 40 nm) was deposited as an organic light emitting layer onto the hole transport layer. Finally, a cathode was formed by laminating a Li film and an Al film. The ITO film was formed by a sputtering method. TPD, A-4, Li film and Al film were formed by an evaporation method at a depositing rate of 0.1 nm/sec. Thus, the EL device was produced. When a DC voltage was applied to the EL device, violet light (peak wavelength of 420 nm) was emitted from A-4. The violet light had a low visibility but had a luminous efficiency of 0.5 cd/A. The same results were obtained when A-1 to A-3 were used instead of A-4.

Example 2

In Example 2, an EL device was produced similarly to Example 1 except for a light emitting layer. In the EL device of Example 2, 80 wt % of A-4 and 20 wt % of 9,10-bis(4-methoxyphenyl)anthracene were codeposited to form a light emitting layer. When a DC voltage was applied to the EL device of Example 2, blue light (peak wavelength: 455 nm, half band width at peak: 94 nm) was emitted. The luminous efficiency was 3.9 cd/A.

When the photoluminescence of the thin film of A-4 was measured, the peak wavelength of photoluminescence was 400 nm. Also, when the photoluminescence of a 9,10-bis (4-methoxyphenyl)anthracene film was measured, the peak wavelength of the photoluminescence was 455 nm. As compared with the EL device of Example 1, the EL device of Example 2 emitted light having longer wavelength. Therefore, we found that the luminescence peak of the organic EL device can be shifted to the side of the longer wavelength by combining A-4 with 9,10-bis(4-methoxyphenyl) anthracene.

Example 3

In Example 3, an EL device was produced similarly to Example 1 except for a light emitting layer. In the EL device of Example 3, instead of A-4, A-5 was used for the light emitting layer. When the DC voltage was applied to the EL device of Example 3, blue light (peak wavelength: 465 nm, half band width at peak: 104 nm) was emitted. The luminous efficiency was 1.9 cd/A.

Example 4

In Example 4, an EL device was produced similarly to Example 1 except for a light emitting layer. In the EL device of Example 4, instead of A-4, A-6 was used for the light emitting layer. When a DC voltage was applied to the EL device of Example 4, blue light (peak wavelength: 470 nm, half band width at peak: 110 nm) was emitted. The luminous efficiency was 1.6 cd/A.

Example 5

In Example 5, an EL device was produced similarly to Example 1 except for a light emitting layer. In the EL device of Example 5, 96 wt % of A-4 and 4 wt % of dibenzopentacene were codeposited to form a light emitting layer. When a DC voltage was applied to the EL device of Example 5, red light (peak wavelength: 600 nm, half band width at peak: 120 nm) was emitted. The luminous efficiency was 1.0 cd/A.

Example 6

In Example 6, an EL device was produced similarly to Example 1 except for a light emitting layer. In the EL device of Example 6, 70 wt % of A-4 and 30 wt % of 2,4-bis(5,6-diphenyl-1,2,4-triazine-3-yl)pyridine were codeposited to form a light emitting layer. When a DC voltage was applied to the EL device of Example 6, red light (peak wavelength: 590 nm, half band width at peak: 105 nm) was emitted. The luminous efficiency was 2.0 cd/A.

Example 7

In Example 7, an EL device was produced similarly to Example 1 except for a light emitting layer. In the EL device of Example 7, 80 wt % of A-4 and 20 wt % of 4-N,N'-bis(p-methylphenyl)amino-α-phenylstilbene were codeposited to form a light emitting layer. When a DC voltage was applied to the EL device of Example 7, blue light (peak wavelength: 460 nm) was obtained. The luminous efficiency was 2.8 cd/A, and the EL device continued to emit light stably.

Example 8

In Example 8, an EL device was produced similarly to Example 1 except for a light emitting layer. In the EL device of Example 8, 80 wt % of A-4 and 20 wt % of 4,4'-bis(α-phenylstyryl)triphenylamine were codeposited to form a light emitting layer. When a DC voltage was applied to the EL device of Example 8, blue light (peak wavelength: 460 nm) was emitted. The luminous efficiency was 3.4 cd/A and the EL device continued to emit light stably.

Example 9

In Example 9, an EL device was produced similarly to Example 1 except for a light emitting layer. In the EL device of Example 9, 80 wt % of A-4 and 20 wt % of phenylstyrylpyrene were codeposited to form a light emitting layer. When a DC voltage was applied to the EL device of Example 9, pale blue light (peak wavelength: 480 nm) was emitted. The luminous efficiency was 5.2 cd/A, and the EL device continued to emit light stably.

Example 10

In Example 10, first, an ITO film was formed on a glass substrate. Then, on the ITO film, a hole transport layer (thickness: 50 nm) made of N,N'-bis(4'-diphenylamino-4-biphenylyl)-N,N'-diphenylbenzidine was formed. Thereafter, by depositing Alq, the organic light emitting layer (thickness: 20 nm) was formed. Then, by depositing A-4, an organic electron transport layer (thickness: 40 nm) was formed. Finally, a cathode made of Al was formed. Thus, the EL device of the present invention was produced. When a DC voltage was applied to the EL device, green light (peak wavelength: 520 nm) was emitted from Alq. The luminous efficiency was 4.0 cd/A, and the EL device continued to emit light stably. Moreover, the same results were obtained when A-1 to A-3 were used instead of A-4.

Example 11

In Example 11, first, an ITO film was formed on a glass substrate. Then, on the ITO film, an organic light emitting layer (thickness: 50 nm) made of 90 wt % of A-2 and 10 wt % of phenylstyrylpyrene was formed. Then, by depositing A-4, an organic electron transport layer (thickness: 50 nm) was formed. Finally, a cathode was formed by laminating a Li film and an Al film. Thus, the EL device of the present invention was produced. When a DC voltage was applied to the EL device, blue-green light (peak wavelength: 470 nm) was emitted. The luminous efficiency was 2.0 ck/A, and the EL device continued to emit light stably.

Example 12

In Example 12, first, an ITO film was formed on a glass substrate. A dye solution was prepared by dissolving polyvinylcarbazole, 2-(4-biphenylyl)-5-(4-t-butylphenyl)-1,3,4-oxadiazole and coumarin 6 (laser dye) in a solvent in a weight ratio of 100:40:0.2, respectively. For the solvent, a mixture in which toluene and THF (tetrahydrofuran) were mixed in the weight ratio of 1:1 was used. Next, the dye solution was spread on the ITO film with a spinner, thus forming an organic light emitting layer (thickness: 100 nm). Next, an organic electron injection layer was formed by depositing A-4 onto the organic light emitting layer. Finally, a cathode (thickness: 100 nm) made of Al was formed. In Example 12, three kinds of EL devices were produced by changing the thickness of the electron injection layer to 0.5 nm, 1 nm or 2 nm. When a DC voltage was applied to these EL devices, in any of these devices, stable and homogeneous luminescence was observed. When the DC voltage was 10 V, the luminance was 500 cd/m$^2$ and luminous efficiency was 2.8 cd/A. When a continuous lighting test with constant current was carried out on these EL devices under the condition of initial luminance of 300 cd/m$^2$, the half value period of the luminance was about 300 hours.

Example 13

In Example 13, first, an ITO film was formed on a glass substrate. Then, on the ITO film, a hole transport layer (thickness: 50 nm) made of N,N'-diphenyl-N,N'-bis(3-methylphenyl)-1,1'-biphenyl-4,4'-diamine was formed. Thereafter, by depositing Alq, an organic light emitting layer (thickness: 50 nm) was formed on the hole transport layer. Thereafter, by depositing A-4, an organic electron injection layer was formed. Finally, a cathode (thickness: 100 nm) made of Al was formed. In Example 13, three kinds of EL devices were produced by changing the thickness of the electron injection layer to 0.5 nm, 1 nm or 2 nm. When a DC voltage was applied to these EL devices, in any of these devices, stable and homogeneous luminescence could be obtained. When the DC voltage was 5V, the luminance was about 500 cd/m$^2$ and the luminous efficiency was 4.5 cd/A. When a continuous lighting test with constant current was carried out on these EL devices under the condition of the initial luminance of 300 cd/m², the half value period of luminance was about 550 hours.

Example 14

In Example 14, first, an ITO film was formed on a glass substrate. Next, on the ITO film, an organic light emitting layer (thickness: 50 nm) made of 98 wt % of N,N'-bis(4'-diphenylamino-4-biphenylyl)-N,N'-diphenylbenzidine and 2 wt % of rubrene was formed. Next, by depositing tris(4-methyl-8-quinolinolato)aluminum, an electron transport layer (thickness: 50 nm) was formed. Next, by depositing A-2, an electron injection layer was formed on the electron transport layer. Finally, a cathode (thickness: 100 nm) made of Al was formed. In Example 14, three kinds of EL devices were produced by changing the thickness of the electron injection layer to 0.5 nm, 1 nm or 2 nm. When the DC voltage was applied to these EL devices, in any of these devices, stable and homogeneous luminescence could be obtained. When the DC voltage was 4V, the luminance was about 500 cd/m² and luminous efficiency was 8.5 cd/A. When a continuous lighting test with constant current was carried out to the EL device under the condition of the initial luminance of 300 cd/m², the half value period of luminance was about 10000 hours.

Example 15

In Example 15, first, an ITO film was formed on a glass substrate. Next, on the ITO film, a hole transport layer (thickness: 50 nm) made of N,N'-diphenyl-N,N'-bis(3-methylphenyl)-1,1'-biphenyl-4,4'-diamine was formed. Next, 99.5 wt % of Alq and 0.5 wt % of Quinacridone were codeposited, thereby forming an electron transport layer (thickness: 20 nm). Next, by depositing Alq, an electron transport layer (thickness: 30 nm) was formed. Next, by redepositing A-2, an electron injection layer was formed on the electron transport layer. Finally, a cathode (thickness: 100 nm) made of Al was formed. In Example 15, three kinds of EL devices were produced by changing the thickness of the electron injection layer to 0.5 nm, 1 nm or 2 nm. When a DC voltage was applied to these EL devices, in any of these devices, stable homogeneous luminescence could be obtained. When the DC voltage was 4.5V, the luminance was about 500 cd/m² and luminous efficiency was 10.5 cd/A. When a continuous lighting test with constant current was carried out to the EL device under the condition of initial luminance of 300 cd/m², the half value period of luminance was about 600 hours.

Example 16

In Example 16, first, an ITO film was formed on a glass substrate. A dye solution was prepared by dissolving polyvinylcarbazole, 2-(4-biphenylyl)-5-(4-t-butylphenyl)-1,3,4-oxadiazole, coumarin 6 (laser dye) and A-4 in a solvent in the weight ratio of 100:40:0.2:10, respectively. For the solvent, a mixture in which toluene and THF were mixed in the weight ratio of 1:1 was used. Next, the dye solution was spread on the ITO film with a spinner, thus forming an organic light emitting layer (thickness: 100 nm). Finally, a cathode (thickness: 100 nm) made of Al was formed. When a DC voltage was applied to the thus produced EL device, stable luminescence was obtained. When the DC voltage was 8V, the luminance was about 500 cd/m² and luminous efficiency was 3.2 cd/A. When a continuous lighting test with constant current was carried out on the EL device under the condition of the initial luminance of 300 cd/m², the half value period of the luminance was about 350 hours.

Example 17

In Example 17, first, an ITO film was formed on a glass substrate. Next, on the ITO film, a hole transport layer (thickness: 50 nm) made of N,N'-diphenyl-N,N'-bis(3-methylphenyl)-1,1'-biphenyl-4,4'-diamine was formed. Next, 90 wt % of Alq and 10 wt % of A-4 were codeposited, thereby forming a light emitting layer (thickness: 50 nm). Finally, a cathode (thickness: 100 nm) made of Al was formed. When a DC voltage was applied to the thus produced EL device, stable luminescence was obtained. When the DC voltage was 5V, the luminance was about 500 cd/m², and the luminous efficiency was 4.5 cd/A. When a continuous lighting test with constant current was carried out to these EL devices under the condition of the initial luminance of 300 cd/m², the half value period of luminance was about 580 hours.

Example 18

In Example 18, first, an ITO film was formed on a glass substrate. Next, on the ITO film, an organic light emitting layer (thickness: 50 nm) was formed by codepositing 98 wt % of N,N'-bis(4'-diphenylamino-4-biphenylyl)-N,N'-diphenylbenzidine and 2 wt % of rubrene. Next, by codepositing 90 wt % of tris(4-methyl-8-quinolinolate)aluminum and 10 wt % of A-2, an electron transport layer (thickness: 50 nm) was formed. Finally, a cathode (thickness: 100 nm) made of Al was formed. When a DC voltage was applied to the thus produced EL device, stable luminescence was obtained. When the DC voltage was 4V, the luminance was about 550 cd/m² and luminous efficiency was 8.4 cd/A. When a continuous lighting test with constant current was carried out on the EL device under the condition of initial luminance of 300 cd/m², the half value period of the luminance was about 12000 hours.

Example 19

In Example 19, first, an ITO film was formed on a glass substrate. On the ITO film, a hole transport layer (thickness: 50 nm) made of N,N'-diphenyl-N,N'-bis(3-methylphenyl)-1,1'-biphenyl-4,4'-diamine was formed. Next, by codepositing 99.5 wt % of Alq and 0.5 wt % of Quinacridone, an organic light emitting layer (thickness: 20 nm) was formed. Next, by codepositing 90 wt % of Alq and 10 wt % of A-2, an electron transport layer (thickness: 30 nm) was formed. Finally, a cathode (thickness: 100 nm) made of Al was formed. When a DC voltage was applied to the thus produced EL device, stable luminescence was obtained. When the DC voltage was 4.5V, the luminance was about 520 cd/n², and the luminous efficiency was 9.7 cd/A. When a continuous lighting test with constant current was carried out on these EL devices under the condition of the initial luminance of 300 cd/m², the half value period of luminance was about 700 hours.

Example 20

In Example 20, first, an ITO film was formed on a glass substrate. Next, on the ITO film, a two-layered organic light emitting layer was formed. First, N,N'-diphenyl-N,N'-bis(3-methylphenyl)-1,1'-biphenyl-4,4'-diamine was deposited to form a first organic light emitting layer (thickness: 70 nm). Furthermore, by codepositing 90 wt % of N,N'-diphenyl-N,N'-bis(3-methylphenyl)-1,1'-biphenyl-4,4'-diamine and 10 wt % of A-1, a second organic light emitting layer (thickness: 30 nm) containing electron injecting compound was formed on the first organic light emitting layer. Finally, a cathode (thickness: 100 nm) made of Al was formed. When a DC voltage was applied to the thus produced EL device, stable luminescence was obtained. When the DC voltage was 10V, the luminance was about 450 cd/m$^2$, and the luminous efficiency was 1.1 cd/A. When a continuous lighting test with constant current was carried out on these EL devices under the condition of initial luminance of 300 cd/m$^2$, the half value period of luminance was about 150 hours.

Example 21

In Example 21, first, an ITO film was formed on a glass substrate. Next, on the ITO film, a hole transport layer (thickness: 50 nm) made of N,N'-diphenyl-N,N'-bis(3-methylphenyl)-1,1'-biphenyl-4,4'-diamine was formed. Next, a two-layered organic light emitting layer was formed. First, a first organic light emitting layer (thickness: 25 nn) was formed by depositing Alq. Next, by codepositing 90 wt % of Alq and 10 wt % of A-1, a second organic light emitting layer (thickness: 25 nm) containing electron injecting compound was formed. Herein, the first organic light emitting layer and the second organic light emitting layer were continuously formed. Finally, a cathode (thickness: 100 nm) made of Al was formed. When a DC voltage was applied to the thus produced EL device, stable luminescence was obtained. When the DC voltage was 5V, the luminance was about 450 cd/m$^2$, and the luminous efficiency was 4.3 cd/A. When a continuous lighting test with constant current was carried out on these EL devices under the condition of initial luminance of 300 cd/m$^2$, the half value period of luminance was about 500 hours.

Example 22

In Example 22, first, an ITO film was formed on a glass substrate. Next, on the ITO film, by codepositing 98 wt % of N,N'-bis(4'-diphenylamino-4-biphenylyl)-N,N'-diphenylbenzidine and 2 wt % of rubrene, an organic light emitting layer (thickness: 50 nm) was formed. Next, a two-layered electron transport layer was formed. First, by depositing tris(4-methyl-8-quinolinolato)aluminum, a first electron transport layer (thickness: 40 nm) was formed. Next, by codepositing 90 wt % of tris(4-methyl-8-quinolinolato)aluminum and 10 wt % of A-1, a second organic light emitting layer (thickness: 10 nm) containing electron injecting compound was formed. Herein, the first electron transport layer and the second electron transport layer were continuously formed. Finally, a cathode (thickness: 100 nm) made of Al was formed. When a DC voltage was applied to the thus produced EL device, stable luminescence was obtained. When the DC voltage was 4.5V , the luminance was about 550 cd/m$^2$, and the luminous efficiency was 8.6 cd/A. When a continuous lighting test with constant current was carried out on this EL device under the condition of initial luminance of 300 cd/m$^2$, the half value period of luminance was about 10500 hours.

Example 23

In Example 23, first, an ITO film was formed on a glass substrate. Next, on the ITO film, a hole transport layer (thickness: 50 nm) made of N,N'-diphenyl-N,N'-bis(3-methylphenyl)-1,1'-biphenyl-4,4'-diamine was formed. Next, by codepositing 99.5 wt % of Alq and 0.5 wt % of quinacridone, an organic light emitting layer (thickness: 20 nm) was formed. Next, a two-layered electron transport layer was formed. First, by depositing Alq, a first electron transport layer (thickness: 20 nm) was formed. Next, by codepositing 90 wt % of Alq and 10 wt % of A-1, a second electron transport layer (thickness: 10 nm) containing electron injecting compound was formed. Finally, a cathode (thickness: 100 nm) made of Al was formed. Herein, the first organic light emitting layer and the second organic light emitting layer were continuously formed. When a DC voltage was applied to the thus produced EL device, stable luminescence was obtained. When the DC voltage was 5.0V, the luminance was about 500 cd/m$^2$, and luminous efficiency was 10 cd/A. When a continuous lighting test with constant current was carried out on the EL device under the condition of initial luminance of 300 cd/m$^2$, the half value period of luminance was about 700 hours.

Comparative Example 1

In Comparative Example 1, first, an ITO film was formed on a glass substrate. Next, on the ITO film, a hole transport layer (thickness: 50 nm) made of TPD was formed. Next, by depositing Alq, an organic electron transport layer (thickness: 50 nm) that works also as a light emitting layer was formed. Finally, a cathode was formed by laminating a Li film and an Al film. Thus, the EL device of Comparative Example 1 was formed. When a DC voltage was applied to the EL device, green light (peak wavelength: 520 nm) was emitted from Alq. The luminous efficiency was 3.3 cd/A. When a continuous lighting test with constant current was carried out on the EL device under the condition of the initial luminance of 300 cd/m$^2$, the half value period of luminance was about 100 hours.

In the organic EL device of Comparative Example 1, as the thickness of the Li film of the cathode was increased, the luminous efficiency was gradually reduced with the increase in the thickness. Furthermore, the increase in a driving voltage was also observed. This is thought to be because the Li film was deteriorated due to oxidation, etc. during or after the film formation. On the other hand, in the EL device including an electron injection layer containing the complex compound (F1) according to the present invention, a stable metal can be used for the cathode. Accordingly, the EL device according to the present invention does not depend upon the thickness of the cathode and has high luminance and is excellent in the long-term stability.

Comparative Example 2

In Comparative Example 2, the EL device was produced similarly to comparative Example 1 except for a light emitting layer. In the EL device of the comparative Example 2, an organic electron transport layer was formed by using PBD instead of Alq. In Comparative Example 2, the hole transport layer also works as the light emitting layer. When a DC voltage was applied to the EL device, blue light (peak wavelength: 460 nm) was emitted from TPD. The luminous efficiency was 0.8 d/A. The emission substantially faded away after one hour.

The invention may be embodied in other specific forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

For example, in the above-mentioned embodiments, EL devices in which the anode, the organic compound layer and the cathode were formed in that order from the glass substrate were explained, however, the EL devices in which the cathode, the organic compound layer and the anode are formed in that order from the glass substrate may also be possible.

Furthermore, in the above-mentioned embodiments, the EL device in which all of the hole transport layer, the light emitting layer, the electron transport layer and the electron injection layer include an organic compound were explained. However, any one of those layers may be formed of an inorganic compound.

The above-mentioned compounds are available from Aldrich, ACROS ORGANICS, Tokyo Kasei Kogyo Co., Ltd. and LAMBDA PHYSIK.

What is claimed is:

1. An electroluminescent device comprising: an anode; a cathode; and an organic compound layer placed between said anode and said cathode, wherein the organic compound layer comprises a complex compound expressed by the formula (F1):

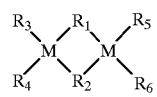

(F1)

wherein R1 and R2, which can be same or different, respectively denote one selected from the group consisting of halogen, alkyl having 1 to 3 carbon atoms, and a bridging ligand having a nitrogen-containing aromatic ring containing at least two nitrogen atoms, and when R1 or R2 is a bridging ligand having a nitrogen-containing aromatic ring, nitrogen in the nitrogen-containing aromatic ring is a coordinating atom; R3, R4, R5 and R6, which can be same or different, respectively denote one member selected from the group consisting of hydrogen, alkyl, aryl, an aryl derivative, a nitrogen-containing aromatic ring and a derivative of a nitrogen-containing aromatic ring; and M is a central metal.

2. The electroluminescent device according to claim 1, wherein said organic material has a pyrazabole structure.

3. The electroluminescent device according to claim 1, wherein said organic material is 4,4,8,8-tetrakis (1H-pyrazol-1-yl) pyrazabole.

4. The electroluminescent device according to claim 1, wherein said organic compound layer is a light emitting layer.

5. The electroluminescent device according to claim 4, said organic compound layer further comprises at least one compound selected from the group consisting of a polycyclic aromatic hydrocarbon compound and a compound including nitrogen-containing aromatic ring having 5 or less carbon atoms.

6. The electroluminescent device according to claim 4, wherein said organic compound layer further comprises a compound having a ring structure selected from the group consisting of an anthracene ring and a phenanthrene ring.

7. The electroluminescent device according to claim 4, wherein said organic compound layer further comprises diphenylanthracene or a diphenylanthracene derivative.

8. The electroluminescent device according to claim 4, wherein said organic compound layer further comprises a compound having a ring structure that is the same as the ring structure of at least one selected from the group consisting of pyrrole, imidazole, pyrazole, triazole, pyridine, pyridazine, pyrazine, pyrimidine, triazine, tetrazine, oxazole and oxadiazole.

9. The electroluminescent device according to claim 8, wherein the peak of the photoluminescense of said compound is 580 nm or more and 680 nm or less.

10. The electroluminescent device according to claim 4, wherein said organic compound layer further comprises an aromatic-substituted amine or a derivative thereof.

11. The electroluminescent device according to claim 4, wherein said organic compound layer further comprises an organic compound forming an exciplex with said organic material.

12. The electroluminescent device according to claim 11, wherein said organic compound is pyrene or a pyrene derivative.

13. The electroluminescent device according to claim 11, further comprising a second organic compound layer placed between said cathode and said light emitting layer, wherein said second organic compound layer also comprises a complex compound expressed by the formula (F1):

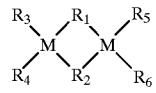

(F1)

wherein R1 and R2, which can be same or different, respectively denote one selected from the group consisting of halogen, alkyl having 1 to 3 carbon atoms, and a bridging ligand having a nitrogen-containing aromatic ring containing at least two nitrogen atoms, and when R1 or R2 is a bridging ligand having a nitrogen-containing aromatic ring, nitrogen in the nitrogen-containing aromatic ring is a coordinating atom; R3, R4, R5 and R6, which can be same or different, respectively denote one member selected from the group consisting of hydrogen, alkyl, aryl, an aryl derivative, a nitrogen-containing aromatic ring and a derivative of a nitrogen-containing aromatic ring; and M is a central metal.

14. The electroluminescent device according to claim 4, further comprising a hole transport layer between said anode and said light emitting layer.

15. The electroluminescent device according to claim 1, wherein said organic compound layer is an electron transport layer or an electron injection layer.

16. The electroluminescent device according to claim 15, further comprising a light emitting layer between said organic compound layer and said anode.

17. The electroluminescent device according to claim 16, further comprising a hole transport layer between said light emitting layer and said anode.

18. The electroluminescent device according to claim 15, wherein said organic compound layer is an electron injection layer and the thickness of said organic compound layer is 0.2 nm to 2 nm.

19. The electroluminescent device according to claim 15, wherein the concentration of said organic material in said organic compound layer increases toward the side of the cathode.

20. The electroluminescent device according to claim 15, wherein said cathode is made of a metal having a work function of 4.0 eV or more.

21. The electroluminescent device according to claim 20, wherein said cathode comprises at least one metal selected from the group consisting of Al, Ag, In and Bi.

* * * * *